United States Patent [19]

McCall

[11] Patent Number: 5,541,532

[45] Date of Patent: Jul. 30, 1996

[54] ALL MOS SINGLE-ENDED TO DIFFERENTIAL LEVEL CONVERTER

[75] Inventor: Kevin J. McCall, Leominster, Mass.

[73] Assignee: Analog Devices, Inc., Norwood, Mass.

[21] Appl. No.: 516,384

[22] Filed: Aug. 17, 1995

[51] Int. Cl.$^6$ .................... H03K 19/094; H03K 19/0175
[52] U.S. Cl. ........................................... 326/68; 326/83
[58] Field of Search ......................... 326/68, 83, 34, 326/27, 73

[56] References Cited

U.S. PATENT DOCUMENTS

| | | | |
|---|---|---|---|
| 4,029,973 | 6/1977 | Kobayashi et al. | 326/83 |
| 4,996,443 | 2/1991 | Tateno | 326/68 |
| 5,204,557 | 4/1993 | Nguyen | 326/83 |

Primary Examiner—Edward P. Westin
Assistant Examiner—Richard Roseen
Attorney, Agent, or Firm—Iandiorio & Teska

[57] ABSTRACT

An all MOS single-ended to differential level converter including: first and second source follower circuits each including first and second PMOS semiconductors each having a drain, a source and a gate electrode; a current source commonly connected to the drain electrodes of the first and second PMOS semiconductors; an input circuit for providing to one of the gate electrodes a single-ended input signal and to the other an inverted single-ended input signal; and first and second load impedances connected to the source electrodes of the first and second PMOS semiconductors, respectively, for providing output analog differential signals at a level which is a function of the load impedances and current source magnitude.

5 Claims, 6 Drawing Sheets

ALL MOS SINGLE-ENDED TO DIFFERENTIAL LEVEL CONVERTER

FIELD OF INVENTION

This invention relates to an improved all MOS single ended to differential level converter with minimum distortion.

BACKGROUND OF THE INVENTION

In conventional applications a digital processor receives a digital input from, for example, a microcontroller or a P.C. and provides a single ended digital output to a level converter. The level converter then provides an analog differential signal to an analog differential processor such as for example a precision delay line in the write channel of a disc drive. The level converter receives the single ended input from the digital processor and transforms it to an analog differential signal compatible with the differential signal processor input. However, when the analog differential processor began to be constructed with CMOS technology to reduce cost the level converter too was made using CMOS technology and major distortions occurred in the output signal to the analog differential process. These were not a major inconvenience, however, since the distortion, namely spikes, had time to settle without disrupting the subsequent processing. Presently the digital processor, level converter, and analog differential processor are all implemented on CMOS on a single chip and the time scale has accelerated to the point where there is not time for the spikes to settle and so the signal processing is seriously degraded.

SUMMARY OF INVENTION

It is therefore an object of this invention to provide an improved MOS singleended to differential level converter with minimum distortion.

It is a further object of this invention to provide such an improved level converter that can operate at even greater speeds of signal processing.

It is a further object of this invention to provide such an improved level converter that is implemented wholly in MOS and is less expensive and easier to fabricate compared to other processes such as Bi-MOS or hi-polar.

It is a further object of this invention to provide such an improved level converter whose switching level is independent of supply voltage and device size variations.

The invention results from the realization that certain signal distortion in an all MOS single ended to differential level converter was the result of the differentially converted NMOS semiconductors being simultaneously off for a period of time each cycle and that this could be avoided and the distortion dramatically reduced by using PMOS semiconductors in combination with or in place of the NMOS semiconductors to overlap the on-time rather than the off-time.

This invention features an all MOS single-ended to differential level converter including first and second source follower circuits each including first and second PMOS semiconductors each having a drain, a source and a gate electrode. There is a current source commonly connected to the drain electrodes of the first and second PMOS semiconductors and an input circuit provides to one of the gate electrodes a single-ended input signal and to the other an inverted single-ended input signal. There are first and second load impedances connected to the source electrodes of the first and second PMOS semiconductors, respectively, for providing output analog differential signals at a level which is a function of the load impedances and current source magnitude.

In a preferred embodiment the current source may be an NMOS semiconductor with its drain electrode connected to the drain electrodes of the first and second semiconductors. The input circuit may include two channels one connected to each of the gate electrodes of the first and second PMOS semiconductors, one of the channels including an inverter and the other including a non-inverting transmission gate for propagation delay equalization. The first and second load impedances may include third and fourth PMOS semiconductors, respectively. There may also be included a replica bias circuit for biasing the third and fourth PMOS semiconductors.

DISCLOSURE OF PREFERRED EMBODIMENT

Other objects, features and advantages will occur to those skilled in the art from the following description of a preferred embodiment and the accompanying drawings, in which.

Figure 1:
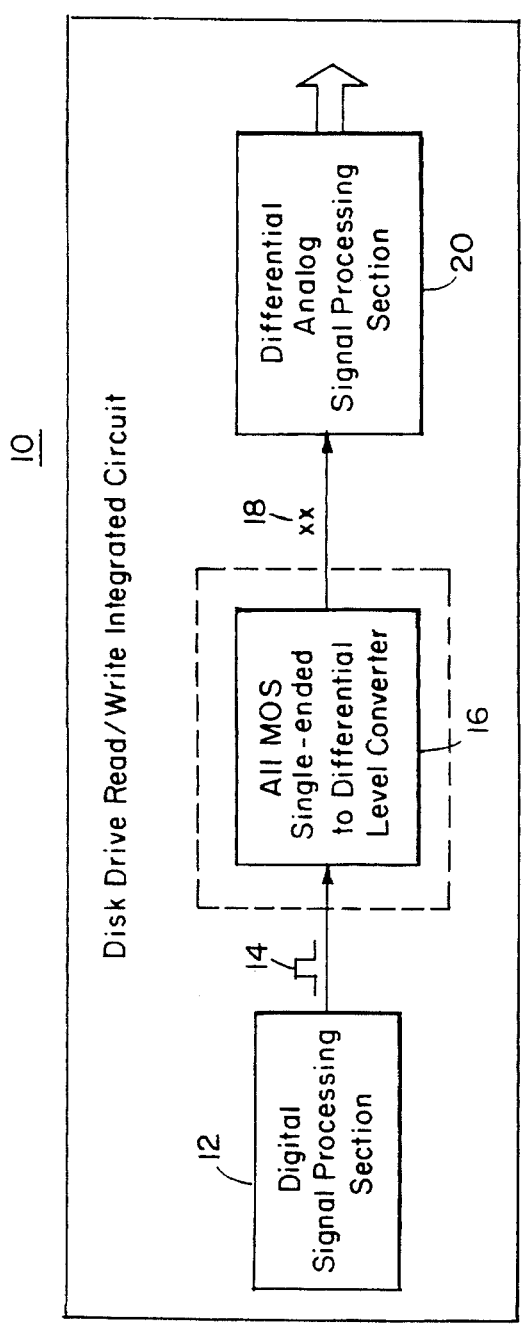
FIG. 1 is a functional block diagram of an all MOS single-ended to differential level converter of this invention in a disc drive read/write integrated circuit.

There is shown in FIG. 1 a disc drive read/write all MOS integrated circuit 10 including a digital signal processing section 12 which could be an encoder or similar device which receives signals from a microcontroller or PC. Its output, a single-ended large magnitude digital-like signal 14, is provided to the all MOS single-ended differential level converter 16 according to this invention. Converter 16 receives the single-ended input 14 and produces a differential analog signal of small or reduced magnitude 18 as input to differential analog signal processing section 20 which may for example be a precision delay line in the write channel of this device.

Figure 2:
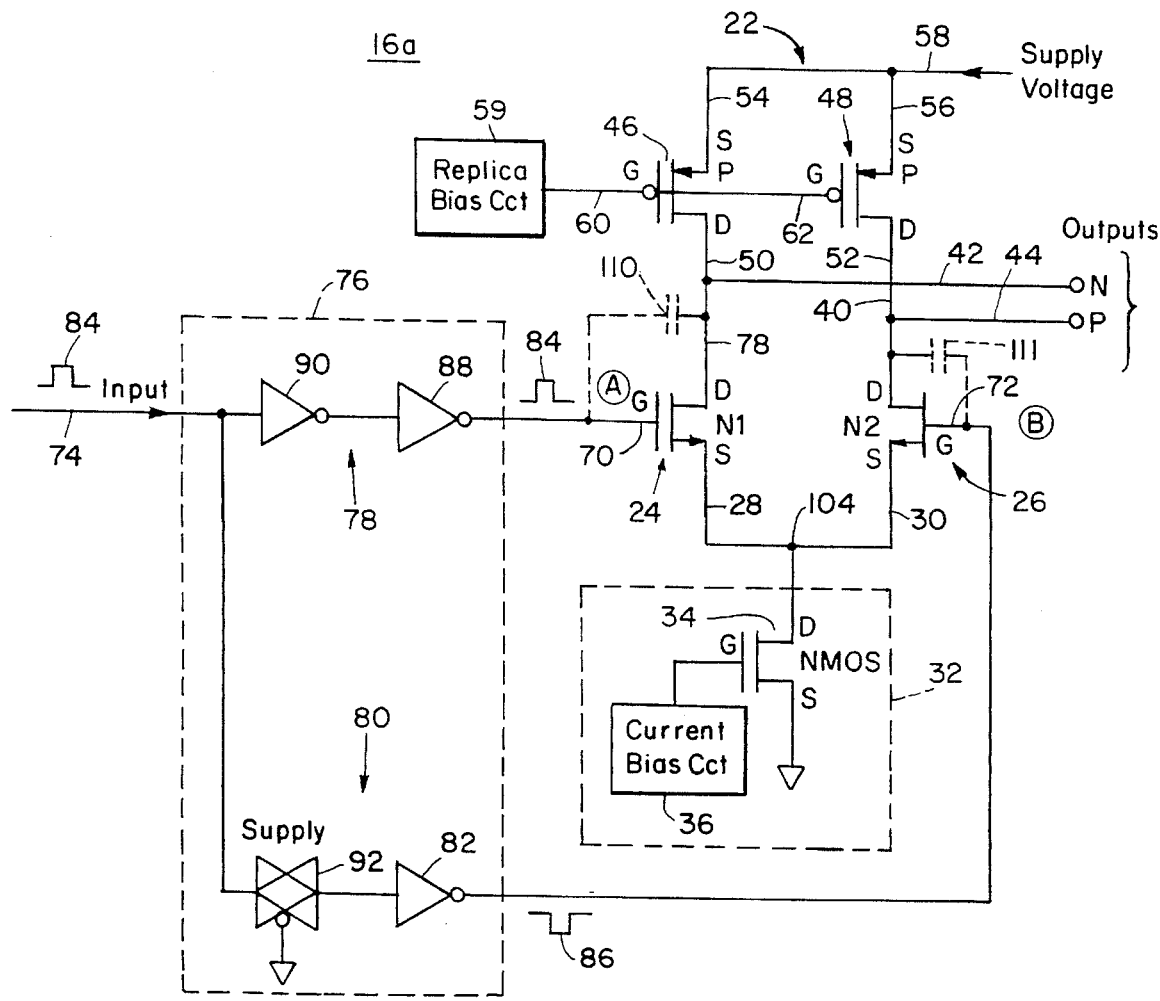
FIG. 2 is a schematic diagram of a prior art all MOS single-ended to differential level converter.

Prior art level converter 16a, FIG. 2, includes differential amplifier 22 which includes two inverters (KJM) which include two NMOS semiconductors 24 and 26 whose source electrodes 28 and 30 are commonly connected to current source 32. Current source 32 includes NMOS semiconductor 34 and a current bias circuit 36. The drain electrodes 38 and 40 of NMOS semiconductors 24 and 26, respectively, are connected to outputs 42 and 44 and to load impedances 46 and 48. Load impedances 46 and 48 are actually replica biased PMOS semiconductors having their drains 50, 52 connected to drains 38 and 40 of NMOS semiconductors 24 and 26, respectively, and their sources 54 and 56 commonly connected to supply voltage 58. Replica biasing circuit 59 as is well known in the art is used to bias the gates 60 and 62 of semiconductors 46 and 48.

Figure 3:
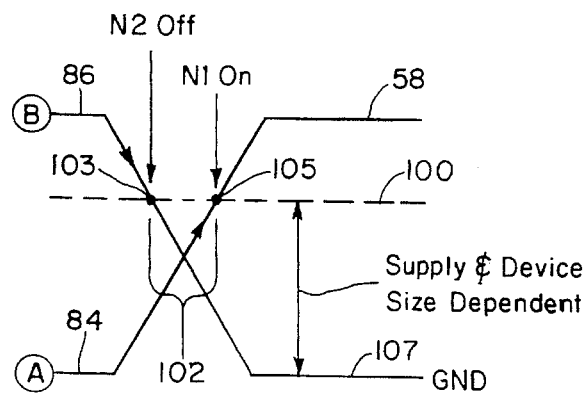
FIG. 3 is an enlarged diagrammatic view of a portion of the switching waveforms showing the cause of the distortions in the prior art level converter circuit of FIG. 2.

Gates 70 and 72 of NMOS semiconductors 24 and 26, respectively, are driven by input 74 through propagation equalization circuit 76. Circuit 76 includes a normal channel 78 and an inverting channel 80. Normal channel 78 provides input 74 to gate 70 in the normal non-inverted form. Channel 80 through the use of inverter 82 provides input signal 84 to gate 70. Inverting channel 80 through inverter 82 provides input signal 84 in its inverted form 86, FIG. 3, to gate 72. In order to keep the propagation delay equal an inverting amplifier 88 corresponding to amplifier 82 is required. However, this inverts input signal 84 so a second inverter amplifier 90 is used so that the signal is twice inverted and is delivered in the positive form 84 that is present at input 74. In channel 80 a transmission gate 92 is used to provide propagation equalization corresponding to inverting amplifier 90 without the inversion.

In operation, replica bias circuit 59 provides a bias to gates 60 and 62 so that PMOS semiconductors 46 and 48 act as a load impedance to control the swing below the supply voltage 58 when NMOS semiconductors 24 and 26 are alternately conducting. PMOS semiconductors 46 and 48 could in fact be replaced by simple impedances or resistances if the accuracy of those elements were sufficient. Typically in MOS circuits they-are not, so replica bias circuits are used to drive MOS semiconductors to provide the requisite precision impedance. With gate 70 positive, NMOS semiconductor 24 is conducting and with gate 72 negative, NMOS semiconductor 26 is cut off: when voltage 84 is low, gate 70 is cut off; when voltage 86 is high gate 72 is conducting.

As the signal 86 begins to decrease it crosses on-off threshold 100 at point 103 and turns off semiconductor 26. But it is not until sometime later that the rising signal 84 crosses on-off threshold 100 at 105 and turns on NMOS semiconductor 24. Thus the period of time 102 between the turning off of semiconductor 24 and the turning on of semiconductor 26 leaves a period during which neither transistor is on, that is, both of them are off, and current source 34 continues to draw current for a short period which draws point 104 down toward ground, semiconductor 24 finally begins to conduct at point 105, FIG. 3. When input signal 84 reaches point 105 at the on-off threshold, semiconductor 24 begins to conduct. Until that time, parasitic capacitance 110 is being charge pumped so that drain 38 of semiconductor 24 is driven to a voltage above the supply voltage on line 58. As soon as point 105 is reached and semiconductor 24 begins to conduct, that voltage drops dramatically. This action generates a positive going spike which causes a substantial distortion in the output signal on lines 42 and 44. A similar negative going but somewhat smaller spike is occasioned by the attempt of current source 32 to draw down point 104 toward ground, followed by its abrupt return in the positive direction when semiconductor 24 begins to conduct. Similar distortions are incurred alternately during the corresponding operation of semiconductor 26.

Figure 4:
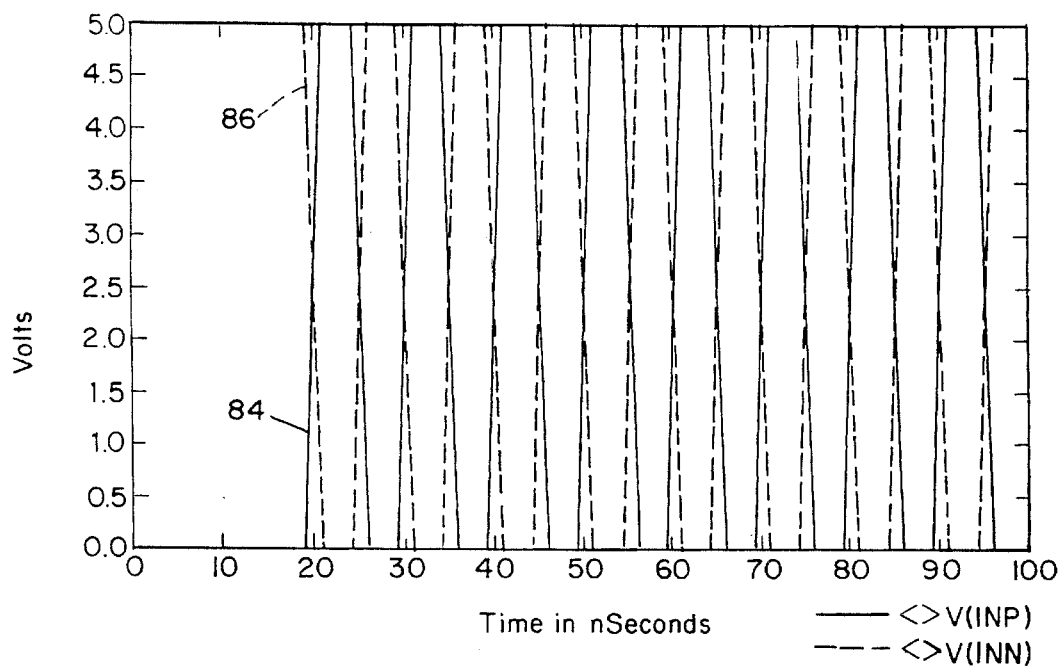
FIG. 4 depicts the input waveforms that drive the prior art level converter of FIG.
Figure 5:
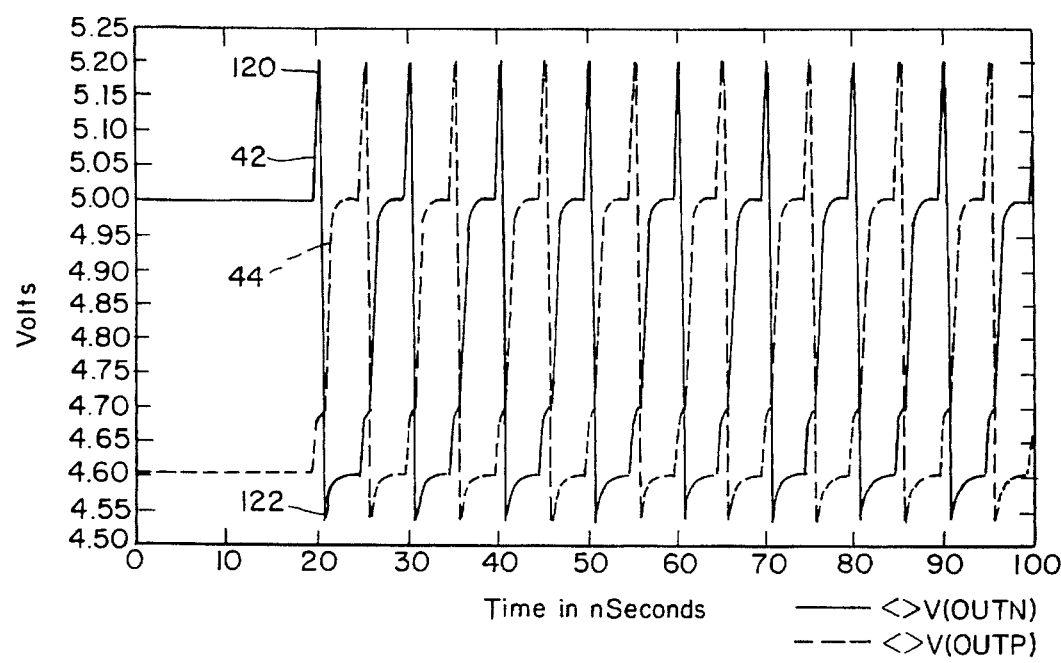
FIG. 5 depicts the output waveterms produced by the level converter of FIG. 2 displaying the substantial distortion which occurs in prior art all MOS level converters.

The substantiality of the distortion can be seen from FIGS. 4 and 5 where in FIG. 4 there is depicted the input signals 84 in solid line and 86 in dashed line, which are relatively clean signals. In FIG. 5 the distorted outputs 42 in solid and 44 in phantom, are shown. There can be seen the positive-going spike 120 occasioned by the charge pumping of the parasitic capacitor 110 and the negative-going spike 122 which occurs because of the attempt by the current source 32 to pull down point 104 toward ground and then the abrupt positive return of the signal when semiconductor 24 finally conducts at point 104, FIG. 3. Similar distortion occurs with respect to semiconductor 26 and parasitic capacitor 111. Note that the threshold 100 which establishes points 103 and 105 is referenced to ground 107. Since it is referenced to ground its relative position with respect to the upper rail or supply voltage 58 is dependent upon the area of the device on the integrated circuit wafer and also on the level of the supply voltage which may fluctuate due to external conditions.

Figure 6:
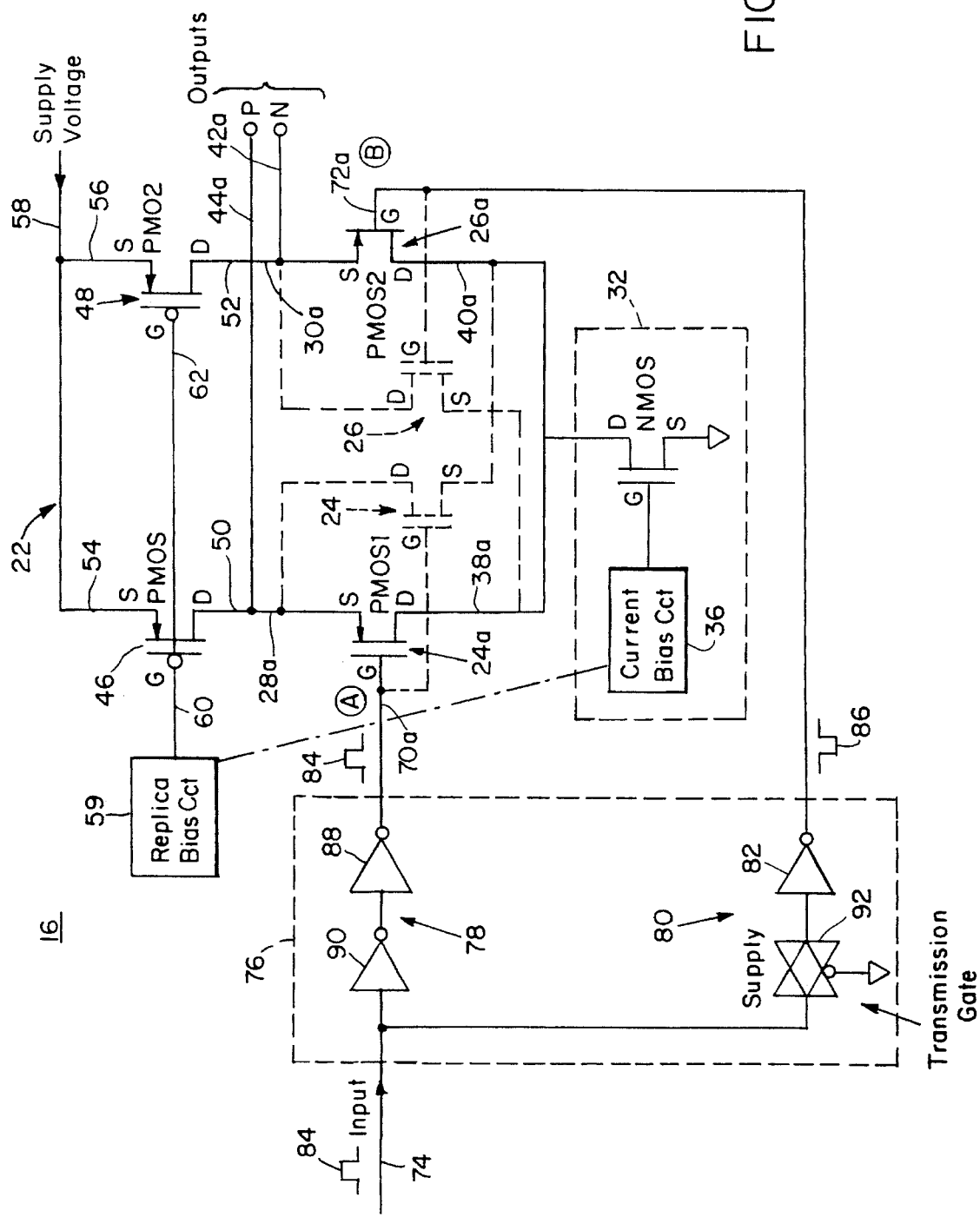
FIG. 6 is an all MOS single-ended differential level converter according to this invention.

In accordance with this invention, the circuit of FIG. 2 is modified in a simple but elegant fashion to remove or reduce the distortion shown in FIG. 5 by simply replacing the NMOS semiconductors 24 and 26 of prior art system 16a with the PMOS semiconductors 24a and 26a of level converter 16, FIG. 6, according to this invention. The gates 70a, 72a of PMOS semiconductors 24a and 26a receive the same signals 84, the normal signal, and 86, the inverted signal, from input 74 as previously. However, since the semiconductors 24a and 26a are now PMOS type the drains 38a and 40a are connected commonly to current source 32 while the sources 28a and 30a are connected to low impedances 46 and 48, respectively, and provide the outputs 44a and 42a which have been inverted with respect to FIG. 2. That is, output 42 was the N output and 44 was the P output in the prior art converter 16a of FIG. 2, whereas in accordance with this invention in level converter 16, FIG. 6, the P output is 44a and the N output is 42a. The PMOS semiconductors 24a and 26a are shown as having totally replaced the NMOS semiconductors 24 and 26, but this is not a necessary limitation of the invention as they can be used in combination with them such as through cross-coupling as shown in phantom in FIG. 6 so that both are still present. However, some experience h as indicated that they are not at all needed once the PMOS semiconductors are installed.

Figure 7:
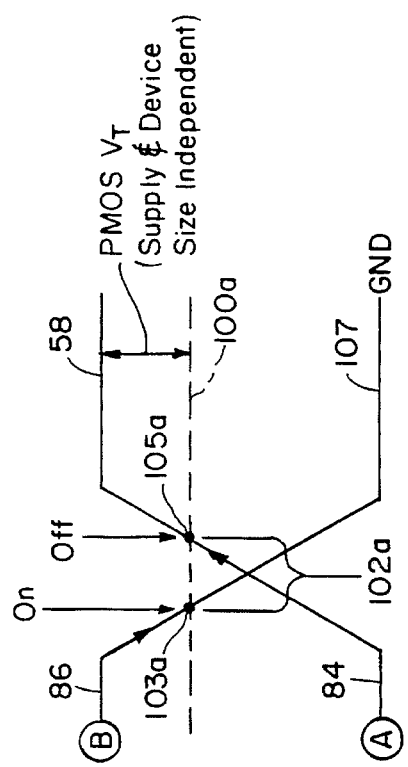
FIG. 7 is an enlarged diagrammatic view of a portion of the switching waveforms that operate the level converter of FIG. 6.
Figure 8:
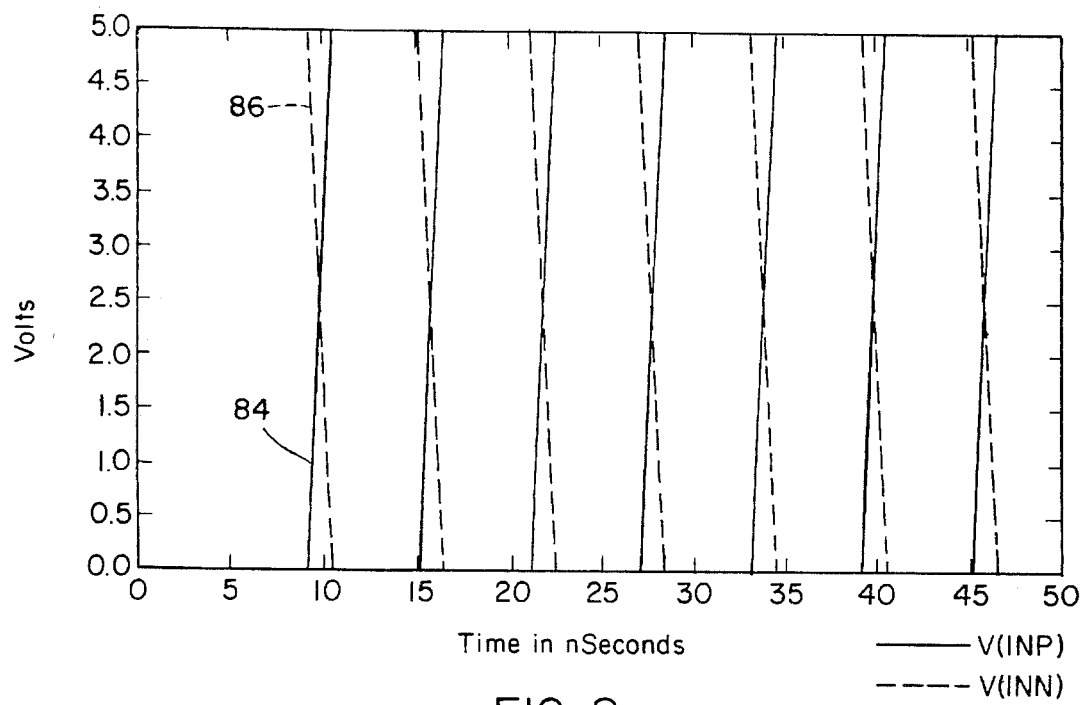
FIG. 8 depicts the input waveforms that drive the level converter of FIG. 6.
Figure 9:
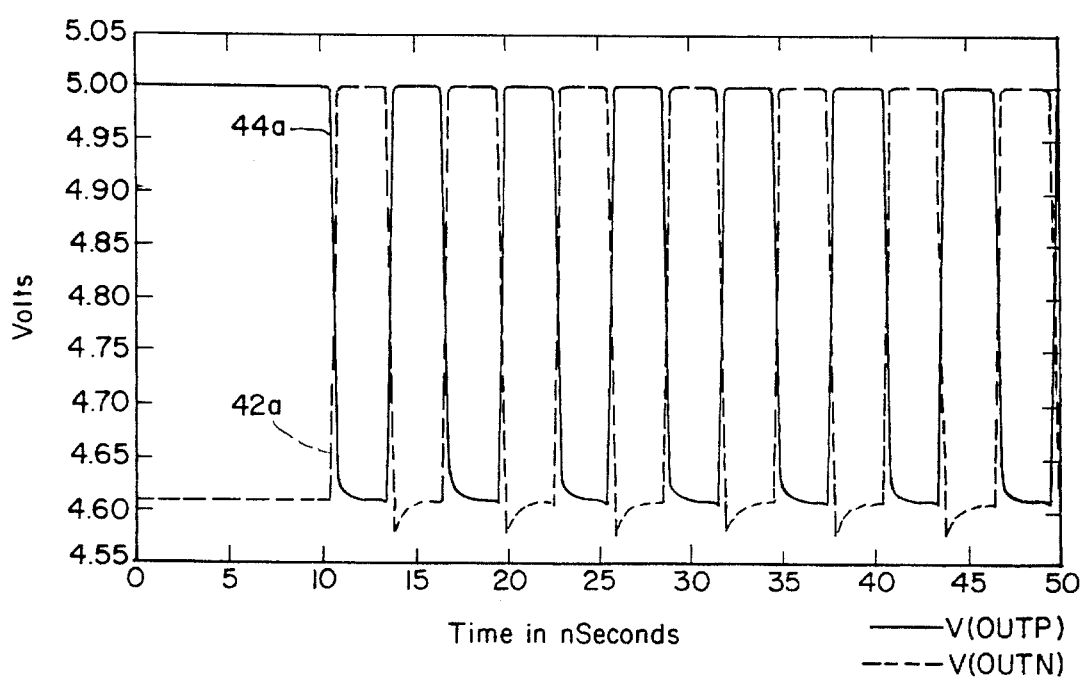
FIG. 9 depicts the output waveforms produced by the level converter of FIG. 6 virtually without distortion.
Figure 10:
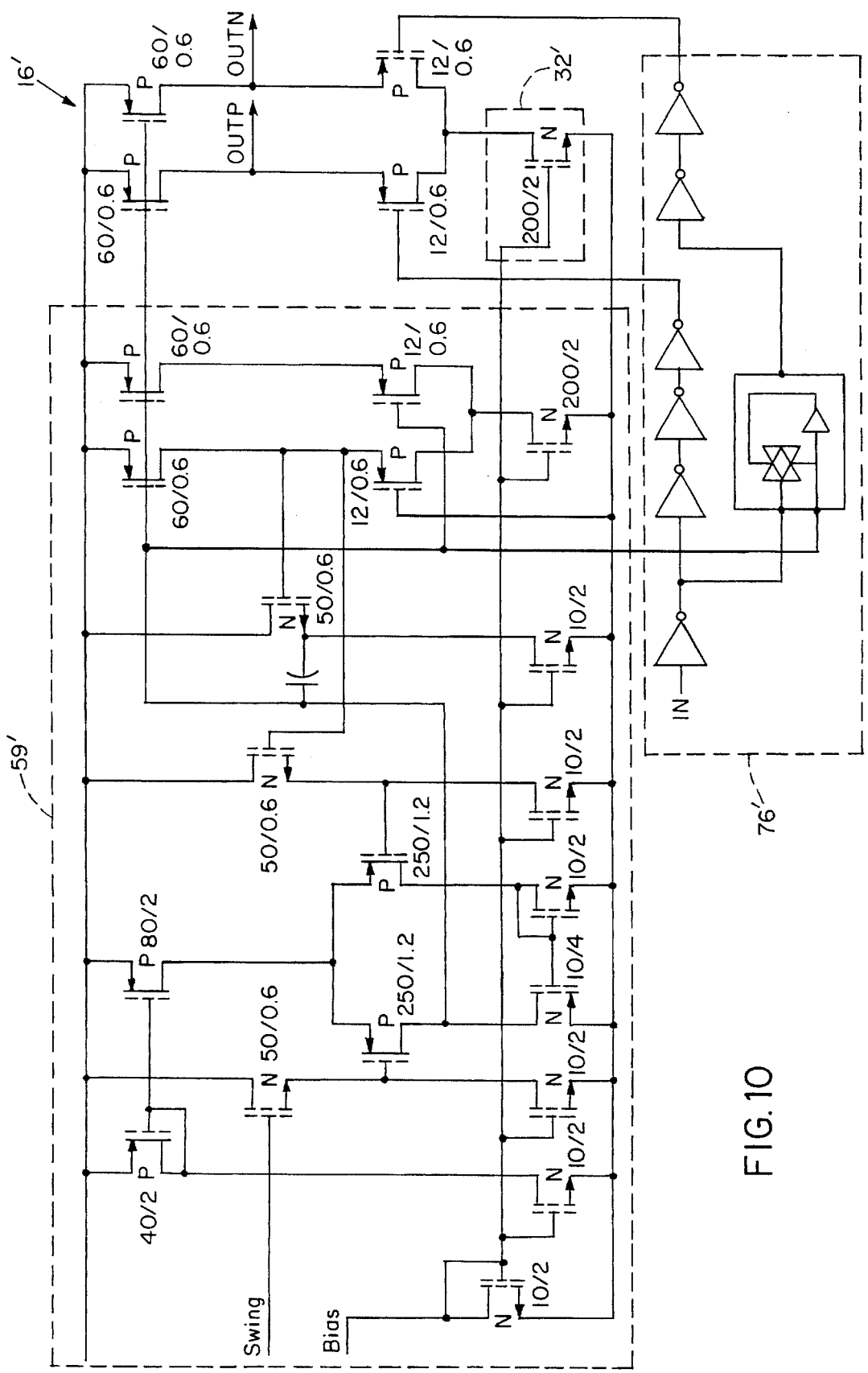
FIG. 10 is a schematic diagram of an all MOS implementation of the single-ended to differential level converter according to this invention.

In operation, PMOS semiconductors 24a and 26a operate oppositely to the manner of NMOS semiconductors 24 and 26. As can be seen in FIG. 7, PMOS semiconductor 24a conducts after it passes through threshold 100a at point 103a. Sometime after that when input signal 84 crosses threshold 100 at point 105a, PMOS semiconductor 26a turns off. Thus there is a period of time 102a during which both semiconductors 24a and 26a are on as opposed to the prior art device where the period of time 102 was one in which both semiconductors 24 and 26 were off. Because of this the distortions of the output signals 44a and 42a are eliminated or substantially reduced as can be seen in FIGS. 8 and 9 where the normal input signal 84 shown in solid lines and the inverted input signal 86 shown in phantom are still relatively clean and sharp. Here it can be seen that the positive spike 120 has been eliminated and the negative-going spike has been virtually eliminated in waveform 44a and substantially reduced in waveform 42a Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An all MOS single-ended to differential level converter comprising:

first and second source follower circuits each including first and second PMOS semiconductors each having a drain, a source and a gate electrode;

a current source commonly connected to said drain electrodes of said first and second PMOS semiconductors;

an input circuit for providing to one of said gate electrodes a single-ended input signal and to the other an inverted said single-ended input signal;

first and second load impedences connected to said source electrodes of said first and second PMOS semiconductors, respectively; and first and second output terminals for providing output analog differential signals at a level which is a function of said load impedances and current source magnitude; said first output terminal connector to said first load impedance and to said first PMOS semiconductor and said second output terminal connected to said second load impedance and to said second PMOS semiconductor.

2. The all MOS single-ended to differential level converter of claim 1 in which said current source is an NMOS semiconductor with its drain electrode connected to said drain electrodes of said first and second semiconductors.

3. The all MOS single-ended to differential level converter of claim 1 in which said input includes two channels one connected to each of said gate electrodes of said first and second PMOS semiconductors one of said channels including an inverter and the other including a non-inverting transmission gate for propagation delay equalization.

4. The all MOS single-ended to differential level converter of claim 1 in which said first and second load impedances include third and fourth PMOS semiconductors, respectively.

5. The all MOS single-ended to differential level converter of claim 4 further including a replica bias circuit for biasing said third and fourth PMOS semiconductors.

* * * * *